(12) United States Patent
Won et al.

(10) Patent No.: US 7,581,550 B2
(45) Date of Patent: Sep. 1, 2009

(54) METHOD OF CLEANING REACTION CHAMBER USING SUBSTRATE HAVING CATALYST LAYER THEREON

(75) Inventors: Seok-Jun Won, Seoul (KR); Weon-Hong Kim, Suwon-si (KR); Min-Woo Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 278 days.

(21) Appl. No.: 11/046,873

(22) Filed: Feb. 1, 2005

(65) Prior Publication Data

US 2005/0170196 A1   Aug. 4, 2005

(30) Foreign Application Priority Data

Feb. 2, 2004   (KR)   ............. 10-2004-0006794

(51) Int. Cl.
- *B08B 9/00* (2006.01)
- *B08B 6/00* (2006.01)
- *B08B 9/093* (2006.01)

(52) U.S. Cl. ............. 134/22.1; 134/1.1; 134/22.18; 134/902; 438/905

(58) Field of Classification Search ............. 134/1.1, 134/22.1, 22.18, 902; 438/905
See application file for complete search history.

(56) References Cited

U.S. PATENT DOCUMENTS

| | | | |
|---|---|---|---|
| 6,133,148 A * | 10/2000 | Won et al. | 438/680 |
| 6,176,936 B1 | 1/2001 | Taguwa | |
| 6,576,481 B2 * | 6/2003 | Itatani et al. | 438/3 |
| 6,613,242 B2 * | 9/2003 | Nakahara et al. | 216/63 |
| 6,750,092 B2 * | 6/2004 | Won et al. | 438/239 |
| 6,770,567 B2 * | 8/2004 | Ko et al. | 438/711 |
| 2002/0072211 A1 * | 6/2002 | Itatani et al. | 438/608 |
| 2002/0076878 A1 * | 6/2002 | Won et al. | 438/239 |
| 2003/0013314 A1 * | 1/2003 | Ying et al. | 438/710 |

FOREIGN PATENT DOCUMENTS

| | | |
|---|---|---|
| JP | 2000-260721 | 9/2000 |
| JP | 2001-049437 | 2/2001 |
| KR | 1020010097410 A | 11/2001 |

\* cited by examiner

*Primary Examiner*—Michael Kornakov
*Assistant Examiner*—Stephen Ko
(74) *Attorney, Agent, or Firm*—Volentine & Whitt, PLLC

(57) ABSTRACT

A method of cleaning a reaction chamber using a substrate having a metal catalyst thereon is disclosed. The method includes preparing a substrate having a catalyst layer to activate a cleaning gas. The substrate is introduced into the reaction chamber. Next, a cleaning gas is introduced into the reaction chamber. Contaminations in the reaction chamber are exhausted. The substrate having a metal catalyst layer is also disclosed.

23 Claims, 6 Drawing Sheets

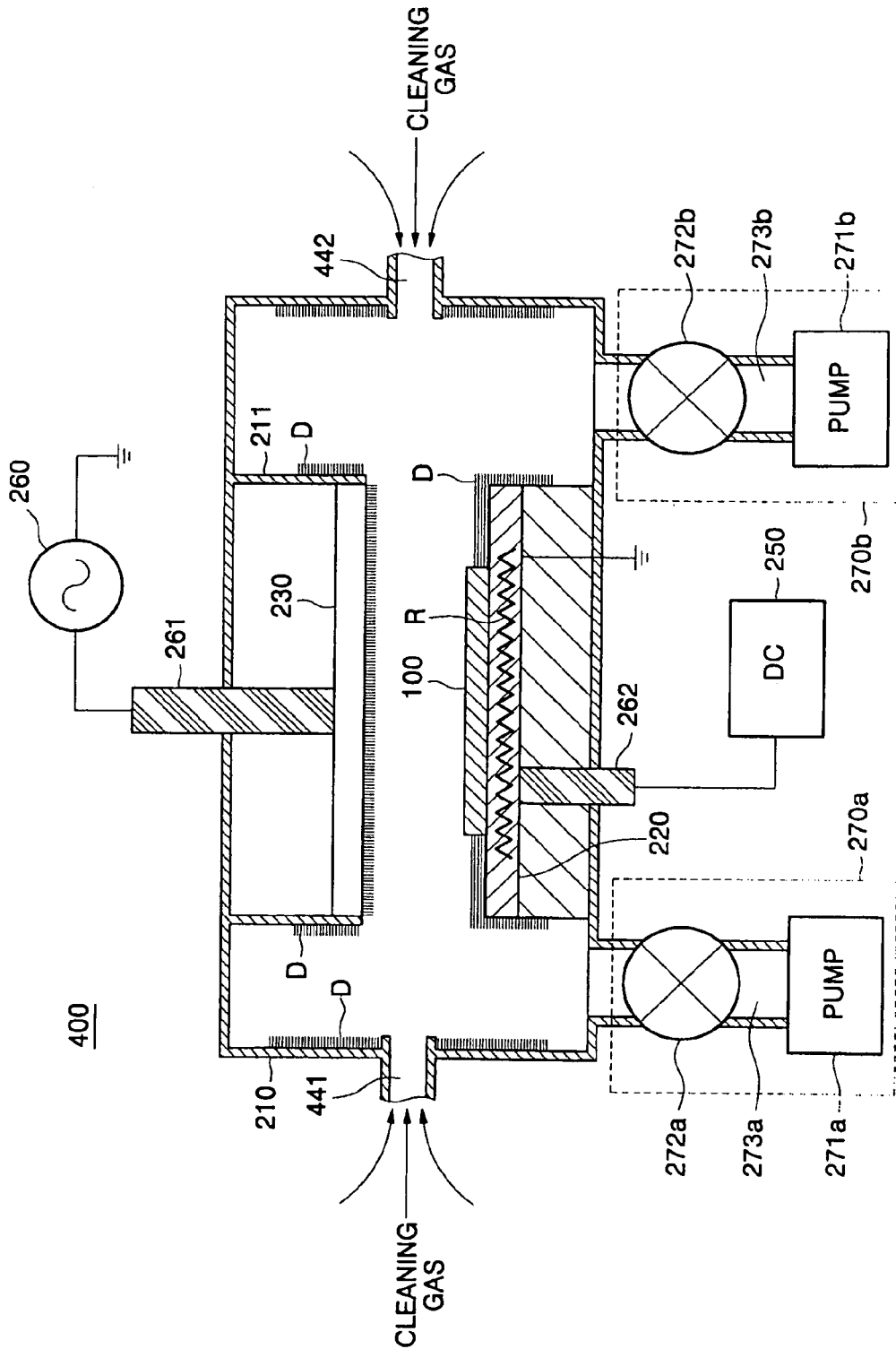

METHOD OF CLEANING REACTION CHAMBER USING SUBSTRATE HAVING CATALYST LAYER THEREON

BACKGROUND OF THE INVENTION

1. Field of the Invention

The present invention generally relates to a substrate and method of cleaning a semiconductor manufacturing apparatus using the same. More particularly, the present invention generally relates to a substrate having catalyst layer thereon and method of cleaning a reaction chamber using the same.

A claim of priority is made to Korean Patent Application No. 2004-6794, filed Feb. 2, 2004, the contents of which are incorporated by reference.

2. Discussion of Related Art

FIG. 1 is a schematic view of a conventional plasma enhanced chemical vapor deposition (PECVD) apparatus 10. PECVD apparatus 10 includes a reaction chamber 11, a susceptor 12 fixed on the bottom portion of reaction chamber 11, an upper electrode 13 opposite susceptor 12 and connected to an RF power (not shown) through a connector 14, a gas inlet 15 provided in a wall of reaction chamber 11, and at least one vacuum pump system 16 provided outside of reaction chamber 11. Upper electrode 13 has a shower head shape, and a plurality of gas distribution holes 13a formed therein.

To form a layer on a substrate, reaction chamber 11 is set to a vacuum condition. The substrate is transferred into reaction chamber 11 and then placed on susceptor 12. Next, a deposition source gas and an inert gas are introduced into reaction chamber 11 through gas inlet 15. The gases introduced into reaction chamber 11 are mixed and then distributed toward the substrate through gas distribution holes 13a. As a result, the mixed gases are introduced into a reaction space between upper electrode 13 and susceptor 12. RF power is applied to upper electrode 13 to generate plasma gas within the reaction space. As ions of the deposition source gases reach the substrate, a layer is formed on the substrate.

However, it is inevitable that contamination layers are formed. Specifically, the contamination layers are formed on inner walls of reaction chamber 11, on upper electrode 13, and on susceptor 12. As the process reactions are repeated, the contamination layer increases in thickness. Particles from the contamination layers peel off and may fall on a substrate during a deposition process, thereby resulting in various device failures.

Accordingly, a cleaning process is required to remove the contamination layers. A cleaning process is carried out by introducing a cleaning gas into reaction chamber 11 to create a reaction between the contamination layer and the cleaning gas with the aid plasma and heat, thereby changing the solid contamination layer into a gas phase. Thereafter, the contamination gas may be exhausted from reaction chamber 11.

In particular, the thickest layer of contamination is formed on the surface of upper electrode 13 facing susceptor 12. Accordingly, when a cleaning process is carried out of sufficient intensity to remove the thickest contamination layer from upper electrode 13, other surface in reaction chamber 11 may be damaged. Further, if the cleaning process is performed while suscepetor 12 is exposed; the surface of susceptor 12 may be damaged as the cleaning process is repeated many times, even though the bias power applied to susceptor 12 is zero.

SUMMARY OF THE INVENTION

The present invention provides a substrate having metal catalyst layer. One embodiment of the invention is directed to a substrate having metal catalyst layer covering at least a portion of a surface of the semiconductor substrate to activate a chamber cleaning gas.

The present invention provides a method of cleaning a reaction chamber using a substrate having metal catalyst layer. One embodiment of the invention is directed to a method of cleaning a reaction chamber by placing a substrate having a metal catalyst layer to activate a cleaning gas in the reaction chamber, introducing the cleaning gas into the reaction chamber, and exhausting contaminates from the reaction chamber.

In another embodiment, the invention is directed to a method of cleaning a reaction chamber by placing a substrate having a metal catalyst layer to activate a cleaning gas on a susceptor fixed in the reaction chamber, introducing a cleaning gas into a space between an upper electrode and the susceptor through at least one gas inlet installed at a wall of the reaction chamber, and exhausting contaminates in the reaction chamber by means of at least one vacuum pump system.

BRIEF DESCRIPTION OF THE DRAWINGS

Aspects of the present invention will be apparent from the description of the preferred embodiments of the present invention, and as illustrated in the accompanying drawings. The drawings are not necessarily to scale, emphasis instead being placed upon illustrating the principles of the invention.

FIG. 4 to FIG. 6 are schematic views of a reaction chamber to which a cleaning method in accordance with an embodiment of the present invention is applied.

DETAILED DESCRIPTION OF PREFERRED EMBODIMENTS

The present invention will now be described more fully hereinafter with reference to the accompanying drawings, in which exemplary embodiments of the invention are shown. It will be understood that when an element such as a layer, a region or a substrate is referred to as being "on" or "onto" another element, it can be directly on the other element or intervening elements may also be present.

Figure 1:
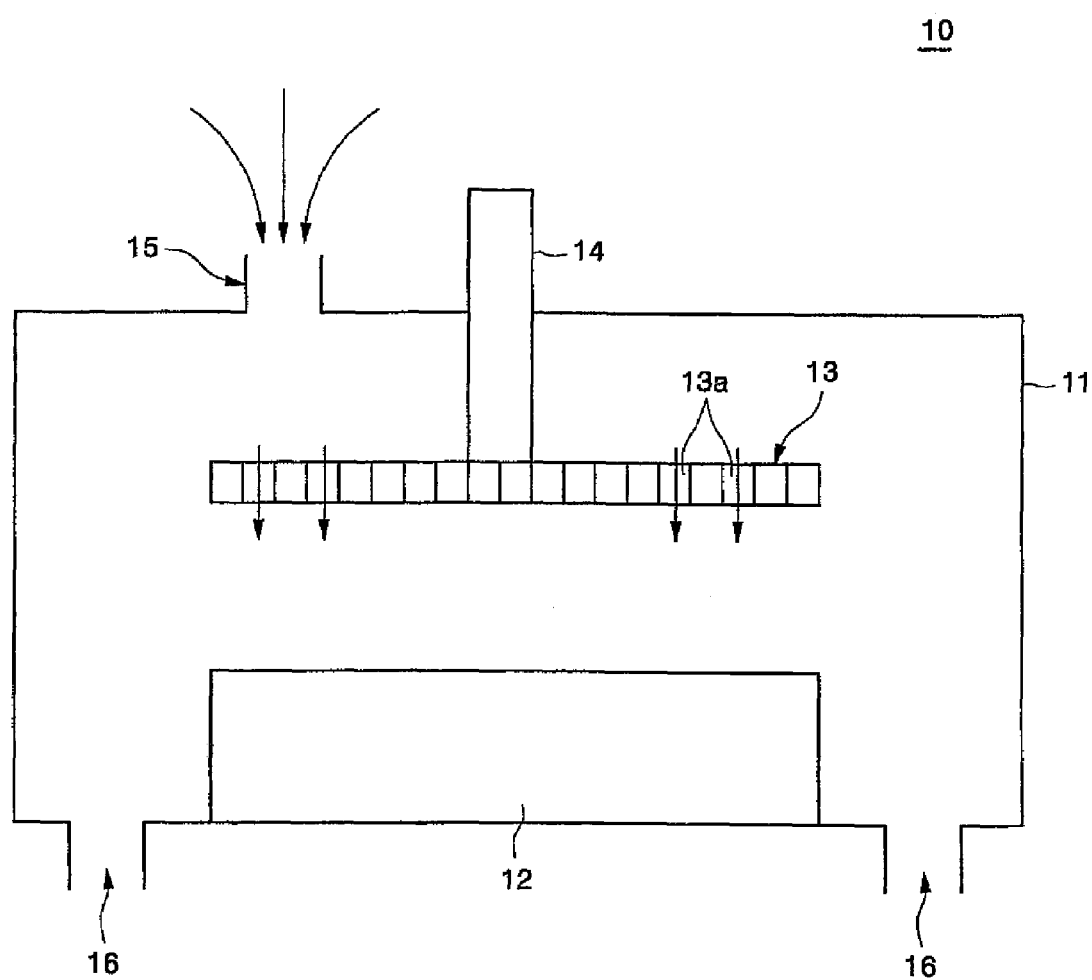
FIG. 1 is a schematic view of a conventional plasma enhanced chemical vapor deposition apparatus.
Figure 2:
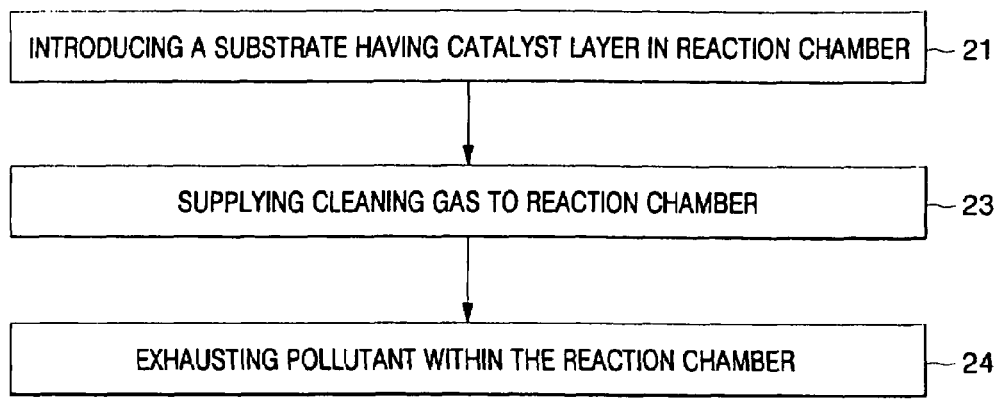
FIG. 2 is a flow chart depicting a method of cleaning a reaction chamber in accordance with an embodiment of the present invention.

In step 21 of FIG. 2, a substrate with a metal catalyst layer for activating a cleaning gas is introduced into a reaction chamber. The substrate may be a semiconductor substrate. In step 23, a cleaning gas is introduced into the reaction chamber. The activated cleaning gas reacts with contamination layers in the reaction chamber. Finally in step 24, the resulting contaminate gas in the reaction chamber is exhausted. If required, steps 23 and 24 may be repeated. In step 23, plasma may be generated once the cleaning gas has been supplied.

The metal catalyst layer may partially or completely cover substrate. The metal catalyst layer may be composed of tungsten (W), ruthenium (Ru), platinum (Pt), and/or a combination thereof.

Figure 3A:
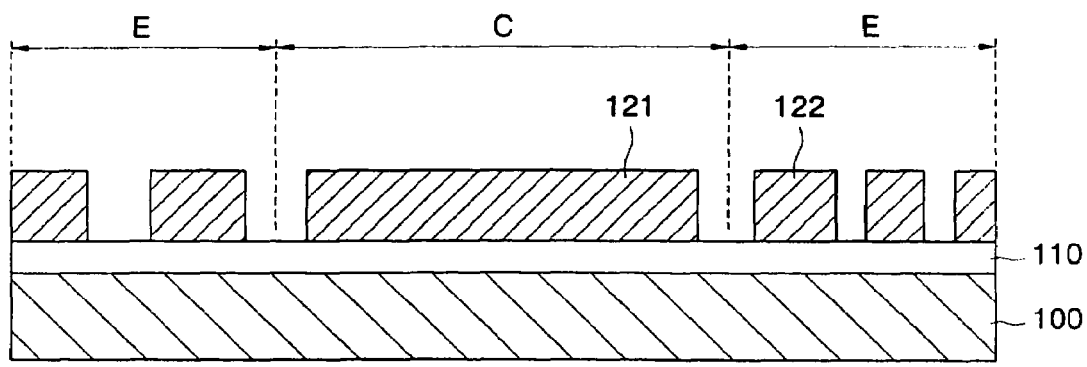
FIG. 3A and FIG. 3B are schematic cross-sectional views of a substrate having a metal catalyst layer thereon in accordance with an embodiment of the present invention.
Figure 3B:
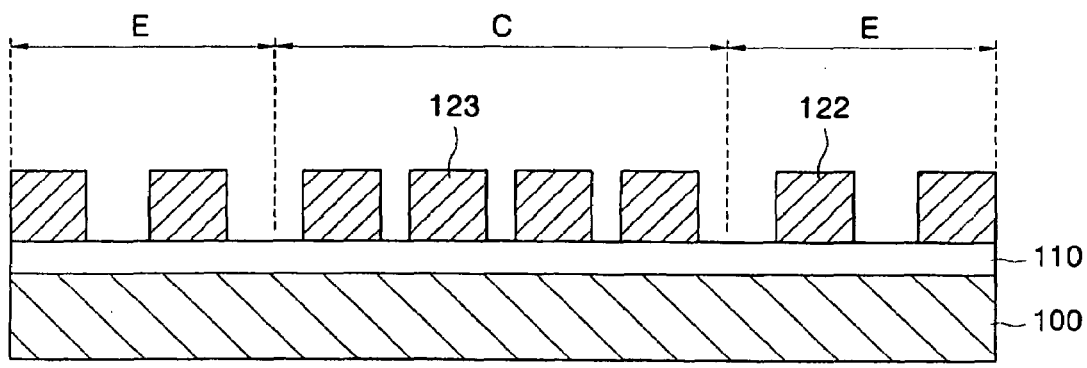

If the metal catalyst layer partially covers the substrate, the substrate is preferably formed of a material with an etch rate equal to or less than 1/10 relative to the contamination layer to protect the substrate during the cleaning process. Further, an oxide layer may be formed on the substrate to protect the substrate from damage while removing the contamination layer. For example, if the contamination layer is of silicon, a silicon layer 110 is formed between substrate 100 and catalyst patterns 121, 122, 123 as shown in FIGS. 3A and 3B. Therefore, silicon substrate 100 is protected. The silicon layer 110 may be a silicon oxide layer.

As can be seen in FIGS. 3A and 3B, catalyst patterns 121, 122 may differ from each other in their respective coverage areas. For example, an upper electrode facing substrate 100 may have a region of relatively thicker contamination and another region of relatively thinner contamination. Accordingly, in region C of substrate 100, facing the relatively thicker contamination layer, a more dense catalyst pattern 121 is formed. On the other hand, a less dense catalyst pattern 122 is formed at regions E facing the relatively thinner contaminate layer. As a result, the concentration of the cleaning gas may be adjusted in relation to the thickness of the contamination layer. As shown in FIG. 3B, a catalyst pattern 123 is formed in region C facing the thicker contamination layer and a less dense catalyst pattern 122 is formed in regions E. As a result, the concentration of the cleaning gas may be adjusted. The metal catalyst layer includes a first metal catalyst layer pattern and a second metal catalyst layer pattern. Pattern density of the first metal catalyst layer pattern may be higher than pattern density of the second metal catalyst layer pattern.

Hereinafter, a method of cleaning a reaction chamber in accordance with an embodiment of the present invention will be described in detail with reference to FIG. 4 though FIG. 6. The reaction apparatus may be a chemical vapor deposition (CVD) apparatus or an automatic layer deposition (ALD) apparatus.

Figure 4:
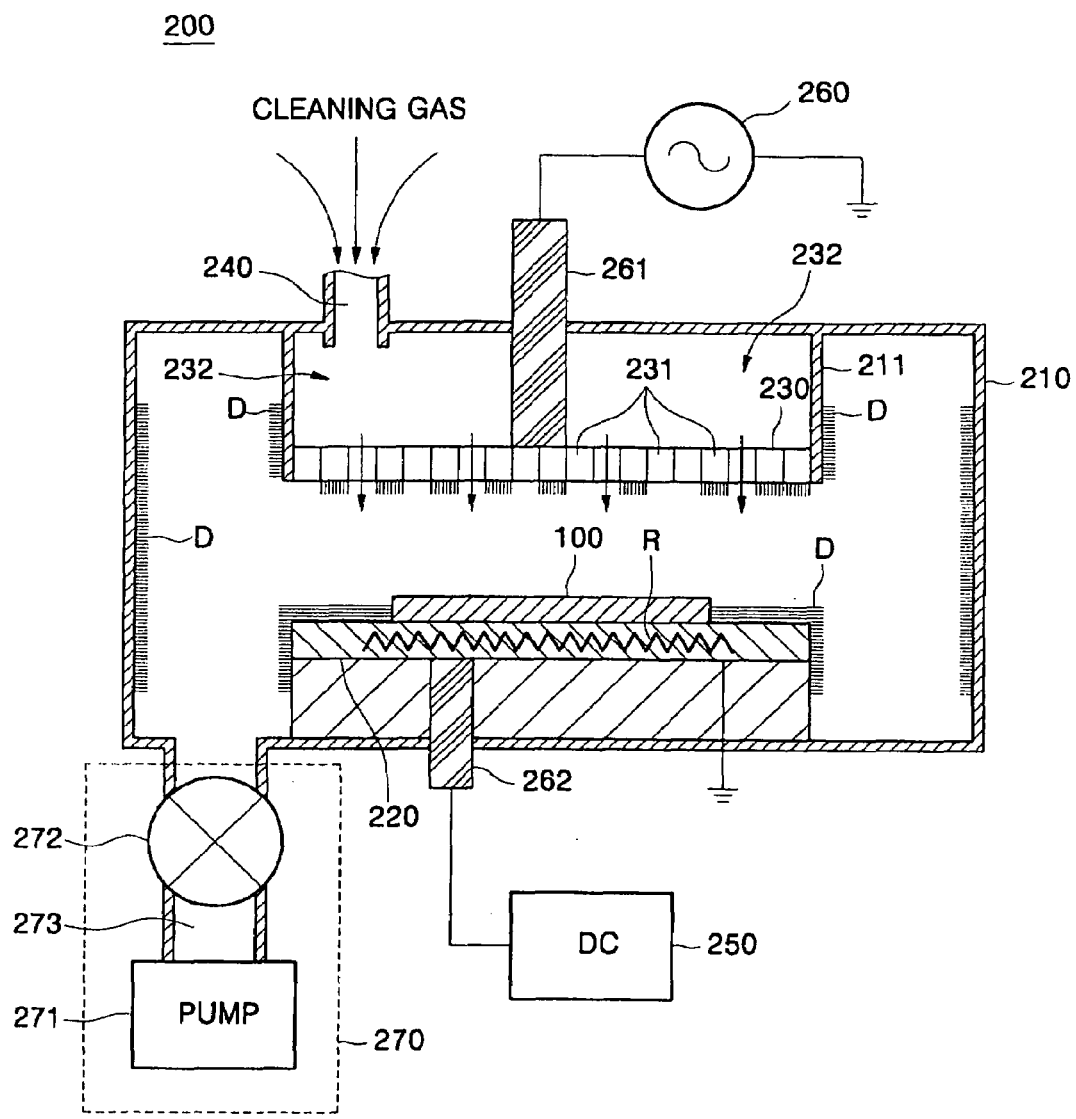

Referring to FIG. 4, a reaction apparatus 200 comprises a reaction chamber 210, a susceptor 220 fixed on the bottom portion of reaction chamber 210, an upper electrode 230 facing susceptor 220 and connected to an RF power source 260 located outside reaction chamber 210, a gas inlet 240 provided in a wall of reaction chamber 210, and at least one vacuum pump system 270 provided outside of reaction chamber 210.

Susceptor 220 supports a substrate 100 and may have a resistor R therein to heat to substrate 100. Susceptor 220 may be connected to a DC power source 250 through a connecter 262. Susceptor 220 may also have an electrostatic chuck (not shown). The electrostatic chuck acts to deliver a bias voltage to substrate 100 and to support substrate 100 on the surface of susceptor 220. Upper electrode 230 may be connected to RF power source 260 through a connecter 261. Upper electrode 230 may have a shape like a shower head, with a plurality of gas distribution holes 231 formed therein. Gas inlet 240 may be located above upper electrode 230. Upper electrode 230 at both ends may be coupled to supporting walls 211. As a result, a gas space 232 is provided between upper electrode 230 and supporting walls 211. Vacuum pump system 270 includes a pump 271, a pressure control valve 272, and a gas outlet 273.

Figure 5:
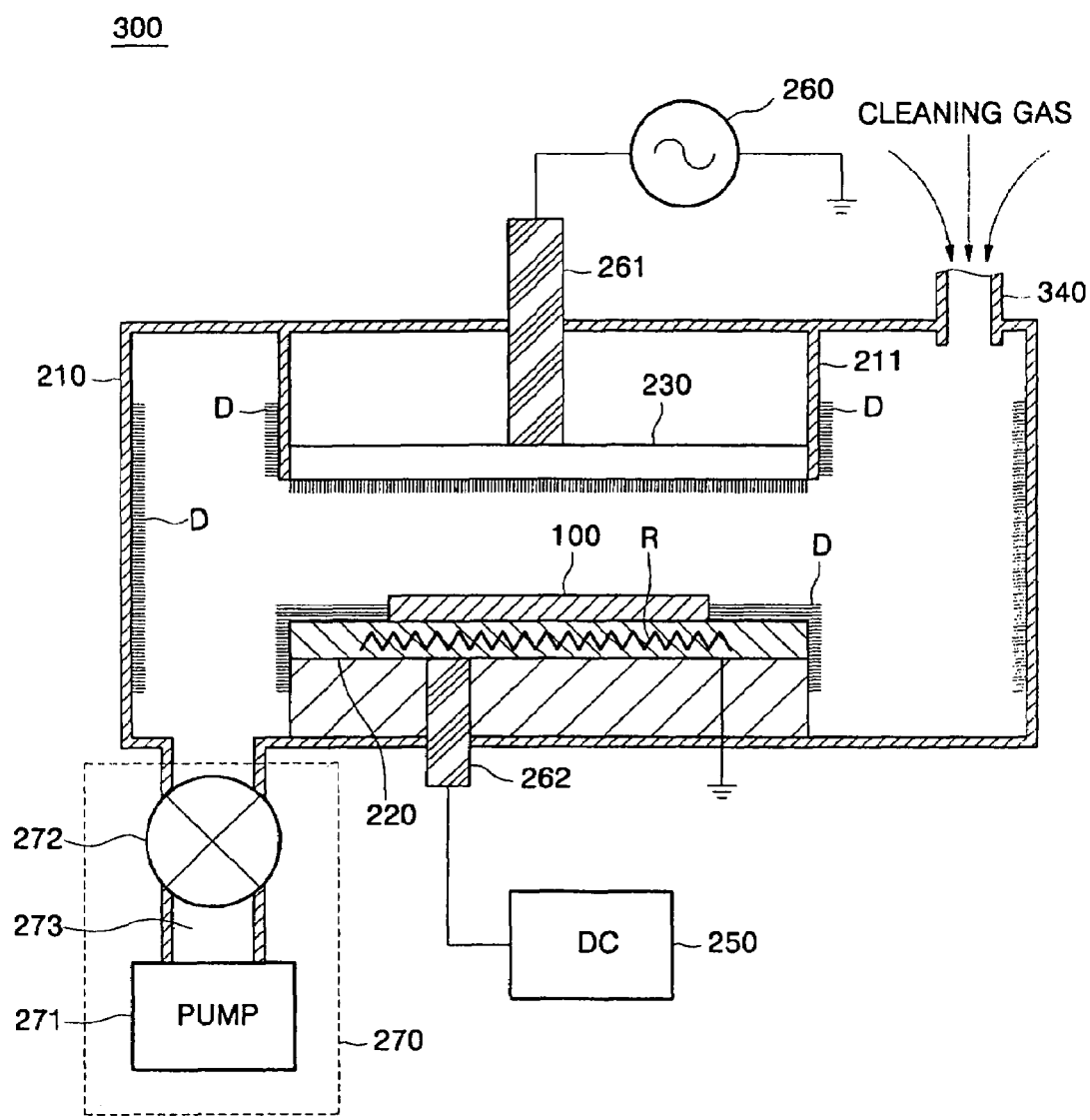

As shown in FIG. 5, a reaction apparatus 300 has an upper electrode 230. In this embodiment, upper electrode does not have gas distribution holes. A gas inlet 340 is located on an upper portion of reaction chamber 300. A vacuum pump system 270 is located on the lower portion of reaction chamber 300.

As shown in FIG. 6, a reaction apparatus 400 has first and second gas inlets 441, 442 respectively located on opposite sidewalls of a reaction chamber 210. Reaction apparatus 400 has first and second vacuum pump systems 270a and 270b. First vacuum pump system 270a is located proximate first gas inlet 441, and second vacuum pump system 270b is located proximate second gas inlet 442.

Referring to FIG. 4, contamination layers D are formed on inner surfaces of reaction chamber 210 as a result of continual deposition and etching processes carried out within the reaction apparatus. To remove contamination layers D, substrate 100 having a catalyst layer thereon is placed on susceptor 220. If the reaction space between upper electrode 230 and substrate 100 is small, the cleaning efficiency is higher. Accordingly, increasing the thickness of substrate 100, decreases the reaction space. Next, a cleaning gas is introduced into reaction chamber 210 through gas inlet 240. The cleaning gas is selected from a group including $H_2$, $BCl_3$, $Cl_2$, $CHF_3$, $O_2$, $NF_3$, $CCl_4$, $SF_6$, $ClF_3$, and/or a combination thereof. An inert gas such as Ar or He is typically supplied to reaction chamber 210 along with the cleaning gas. The cleaning gas is selected based on the material composition of the contamination layer. Accordingly, the cleaning gas is not limited to the gases described above and may include various other type of gases. The cleaning gas dissociates into atoms after adhering to the surface of the catalyst layer, as a result, increasing the reaction efficiency between the cleaning gas and the contamination layer. The solid contamination layer reacts with the cleaning gas and turns into contamination gas. And then, the contamination gas is exhausted from reaction chamber 210 by vacuum pump system 270.

In FIG. 6, the cleaning gas is introduced into reaction chamber 210 through first gas inlet 441; and subsequently, the contamination gas is exhausted by second vacuum pump system 270b, which is located on the opposite side first gas inlet 441. Similarly, the cleaning gas is supplied to reaction chamber 210 through second gas inlet 442; and subsequently, the contamination gas is exhausted by first vacuum pump system 270a, which is located on the opposite side of second gas inlet 442. By repeating and changing the supply of cleaning gas from an inlet on one side and exhausting contaminated gas on the opposite side, the cleaning efficiency is increased. In FIG. 6, reference numbers 271a, 271b, 272a, 272b, 273a, and 273b indicate a first pump, a second pump, a first pressure control valve, a second pressure control valve, a first gas outlet, and a second gas outlet, respectively.

Further, generation of plasma in reaction chamber 210 during the cleaning process may further increase the cleaning efficiency. Specifically, after introducing the cleaning gas into reaction chamber 210, RF power is supplied to upper electrode 230, plasma is created from the cleaning gas and applied to the space between upper electrode 230 and substrate 100.

Preferred embodiments of the present invention have been disclosed with reference to specific apparatuses, processes, and related terms. However, the invention is not limited to these examples. Accordingly, it will be understood by those of ordinary skill in the art that various changes in form and details may be made without departing from the scope of the present invention.

What is claimed is:

1. A method of cleaning a contamination layer from a reaction chamber during a dedicated cleaning process, the contamination layer comprising a thicker portion and a thinner portion, the method comprising:

prior to the dedicated cleaning process, placing a substrate having a metal catalyst layer adapted to activate a cleaning gas into the reaction chamber, wherein the metal catalyst layer comprises more dense catalyst patterns formed on a first region of the substrate facing the thicker portion of the contamination layer, and less dense catalyst patterns formed on a second region of the substrate facing the thinner portion of the contamination layer;

during the dedicated cleaning process, introducing the cleaning gas into the reaction chamber; and exhausting contaminates from the reaction chamber.

2. The method of claim 1, wherein the metal catalyst layer is formed on a surface of the substrate.

3. The method of claim 1, wherein the metal catalyst layer comprises a metal selected from the group consisting of Ru, W, Pt, and a combination thereof.

4. The method of claim 1, wherein the cleaning gas comprises at least one gas selected from a group consisting of $H_2$, $BCl_3$, $Cl_2$, $CHF_3$, $O_2$, $NF_3$, $CF_4$, $CCl_4$, $SF_6$, $ClF_3$, and a mixture thereof.

5. The method of claim 1, further comprising: introducing an inert gas into the reaction chamber during the dedicated cleaning process.

6. The method of claim 5, wherein the inert gas is Argon or Helium.

7. The method of claim 1, further comprising:

generating plasma during the dedicated cleaning process after introducing the cleaning gas into the reaction chamber.

8. The method of claim 1, wherein the first region of the substrate is a central portion of the substrate, and the second region of the substrate is a peripheral portion of the substrate.

9. The method of claim 1, further comprising: forming an oxide layer between the substrate and the metal catalyst layer.

10. A method of cleaning a contamination layer from the interior of a reaction chamber comprising an upper electrode opposing a susceptor, the contamination layer comprising a thicker portion and a thinner portion, and the method comprising:

placing a substrate on the susceptor, wherein an upper surface the substrate, consists of a metal catalyst layer adapted to activate a cleaning gas, wherein the metal catalyst layer comprises more dense catalyst patterns formed on a first region of the substrate facing the thicker portion of the contamination layer, and less dense catalyst patterns formed on a second region of the substrate facing the thinner portion of the contamination layer;

introducing the cleaning gas into a space between the upper electrode and the susceptor through at least one gas inlet installed in a wall of the reaction chamber; and exhausting contaminates from the reaction chamber using at least one vacuum pump system.

11. The method of claim 10, wherein the metal catalyst layer comprises a metal selected from the group consisting of Ru, W, Pt and a combination thereof.

12. The method of claim 10, wherein the cleaning gas comprises at least one gas selected from a group consisting of $H_2$, $BCl_3$, $Cl_2$, $CHF_3$, $O_2$, $NF_3$, $CF_4$, $CCl_4$, $SF_6$, $ClF_3$, and a mixture thereof.

13. The method of claim 10, further comprising:
introducing an inert gas into the reaction chamber.

14. The method of claim 13, wherein the inert gas is Argon or Helium.

15. The method of claim 10, further comprising:
generating plasma after introducing the cleaning gas into the reaction chamber.

16. The method of claim 10, wherein the first region of the substrate is a central portion of the substrate, and the second region of the substrate is a peripheral portion of the substrate.

17. The method of claim 10, further comprising:
forming an oxide layer between the substrate and the metal catalyst layer.

18. A method of cleaning a contamination layer from the interior of a reaction chamber the contamination layer comprising a thicker portion and a thinner portion, the method comprising:

placing a substrate having a metal catalyst layer adapted to activate a cleaning gas into the reaction chamber, wherein the metal catalyst layer comprises more dense catalyst patterns formed on a first region of the substrate facing the thicker portion of the contamination layer, and less dense catalyst patterns formed on a second region of the substrate facing the thinner portion of the contamination layer;

introducing the cleaning gas into the reaction chamber; and exhausting contaminates from the reaction chamber.

19. The method of claim 18 wherein the reaction chamber comprises a susceptor upon which the substrate is placed and an opposing upper electrode disposed above the susceptor, wherein the first region of the substrate is a central portion of the substrate; and the second region of the substrate is a peripheral portion of the substrate surrounding the first region of the substrate.

20. The method of claim 18, further comprising:
forming an oxide layer between the substrate and the metal catalyst layer.

21. A method of cleaning a contamination layer from a reaction chamber during a dedicated cleaning process chamber, the contamination layer comprising a thicker portion and a thinner portion, the method comprising:

prior to the dedicated cleaning process, placing a substrate having a metal catalyst layer adapted to activate a cleaning gas into the reaction chamber, wherein the metal catalyst layer comprises first metal catalyst patterns formed on a first region of the substrate facing the thicker portion of the contamination layer, and second metal catalyst patterns formed on a second region of the substrate facing the thinner portion of the contamination layer, wherein a width of the first metal catalyst patterns is greater than a width of the second metal catalyst pattern;

during the dedicated cleaning process, introducing the cleaning gas into the reaction chamber; and exhausting contaminates from the reaction chamber.

22. The method of claim 21, wherein the first region of the substrate is a central portion of the substrate, and the second region of the substrate is a peripheral portion of the substrate.

23. The method of claim 21, further comprising:
forming an oxide layer between the substrate and the metal catalyst layer.

* * * * *